United States Patent [19]

Nagasawa

[11] Patent Number: 5,083,046
[45] Date of Patent: Jan. 21, 1992

[54] SOURCE-COUPLED FET LOGIC TYPE OUTPUT CIRCUIT

[75] Inventor: Hironori Nagasawa, Yokohama, Japan

[73] Assignee: Kabushiki Kaisha Toshiba, Kawasaki, Japan

[21] Appl. No.: 593,043

[22] Filed: Oct. 5, 1990

[30] Foreign Application Priority Data

Oct. 6, 1989 [JP] Japan .................. 1-261574

[51] Int. Cl.$^5$ ................ H03K 19/017; H03K 19/0175
[52] U.S. Cl. ........................................ 307/448; 307/475
[58] Field of Search ................ 307/448, 475, 455, 264

[56] References Cited

U.S. PATENT DOCUMENTS

| | | | |
|---|---|---|---|
| 4,093,925 | 6/1978 | Yokoyama | 330/227 |
| 4,945,258 | 7/1990 | Picard et al. | 307/475 |
| 4,958,094 | 9/1990 | Ishii et al. | 307/455 |
| 4,992,681 | 2/1991 | Urakawa et al. | 307/264 |

FOREIGN PATENT DOCUMENTS

| | | |
|---|---|---|
| 0309063 | 3/1989 | European Pat. Off. . |
| 1373639 | 8/1964 | France . |
| 62-64121 | 3/1987 | Japan . |
| 62-172819 | 7/1987 | Japan . |

OTHER PUBLICATIONS

Japanese Patent Abstract, vol. 12, No. 308 (E-647) [3155], Aug. 22, 1988; Japanese Patent Document No. 63-74215, Apr. 4, 1988, Mitsubishi Electric Corp.
Japanese Patent Abstract, vol. 13, No. 34 (E-708) [3382], Jan. 25, 1989; Japanese Patent Document No. 63-232711, Sep. 28, 1988, NEC Corporation.
IBM Technical Disclosure Bulletin, vol. 18, No. 11, Apr. 1976; E. Colao et al., "Totem-Pole Driver for High-Capacitance Loads".

Primary Examiner—Edward P. Westin
Assistant Examiner—Andrew Sanders
Attorney, Agent, or Firm—Finnegan, Henderson, Farabow, Garrett and Dunner

[57] ABSTRACT

In a source-coupled FET logic type output circuit, the drain electrodes of first and second FETs are coupled through a level shift element and load elements to a high-voltage power source, the gate electrodes of the FETs are respectively connected to first and second input terminals, and the source electrodes of these transistors which are coupled together are coupled to a low-voltage power source by a first constant-current power source. Furthermore, between the high-voltage power source and the low-voltage power source, there are connected a third FET with its gate electrode coupled to the drain electrode of the first FET, level shift elements, a second constant-current power source, a fourth FET with its gate electrode coupled to the drain electrode of the second FET, a level shift element, a third constant-current power source, a fifth FET with its gate electrode coupled between the fourth FET and the level shift element, a sixth FET with its gate electrode coupled between the third level shift element and the second constant-current power source, and fifth level shift element. An output signal with the potential corresponding to that of a complementary signal is obtained at an output terminal expending from a connection point between the fifth and sixth FETs.

13 Claims, 3 Drawing Sheets

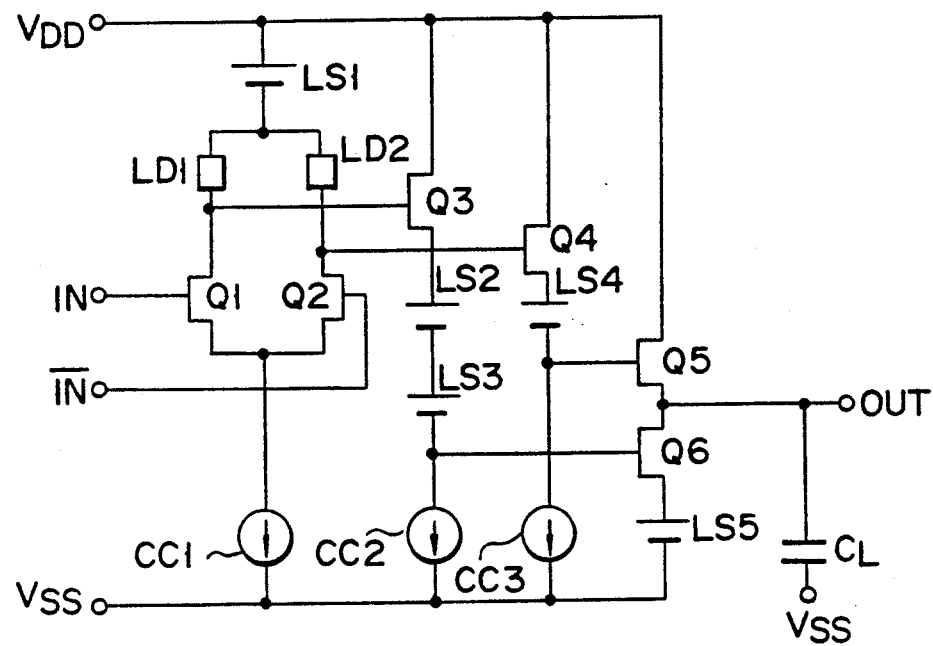
F I G. 2
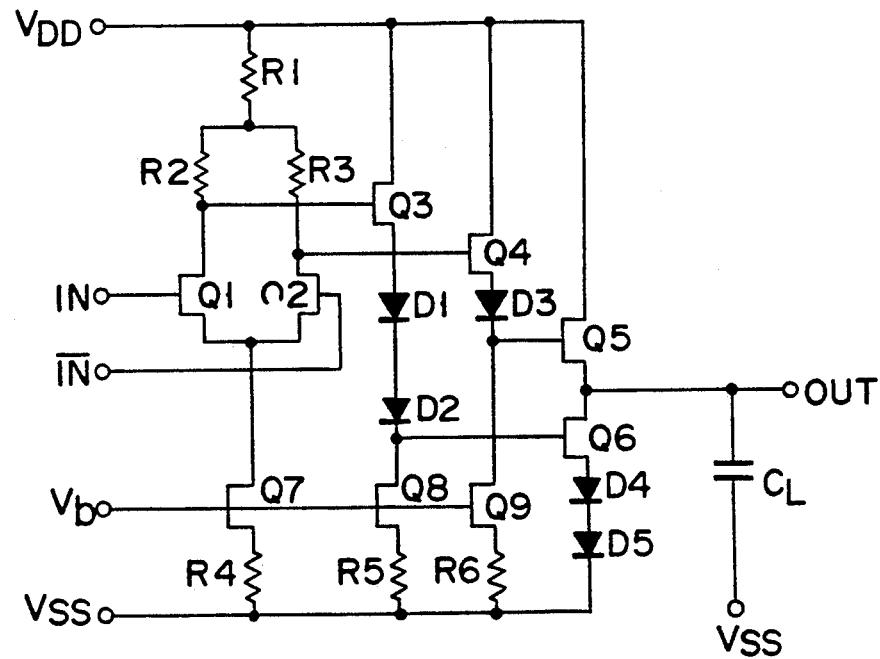
F I G. 3

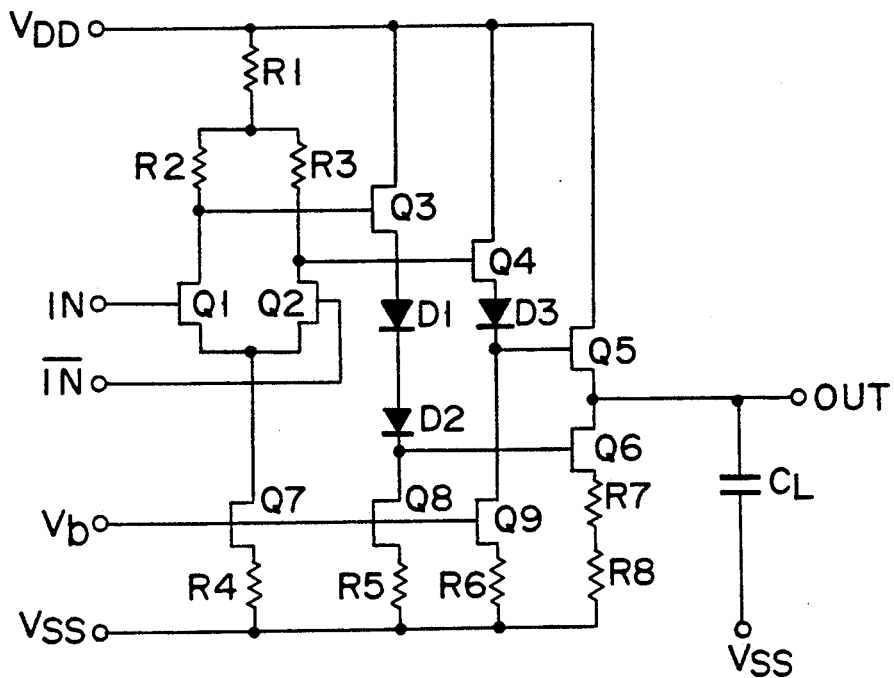
F I G. 4
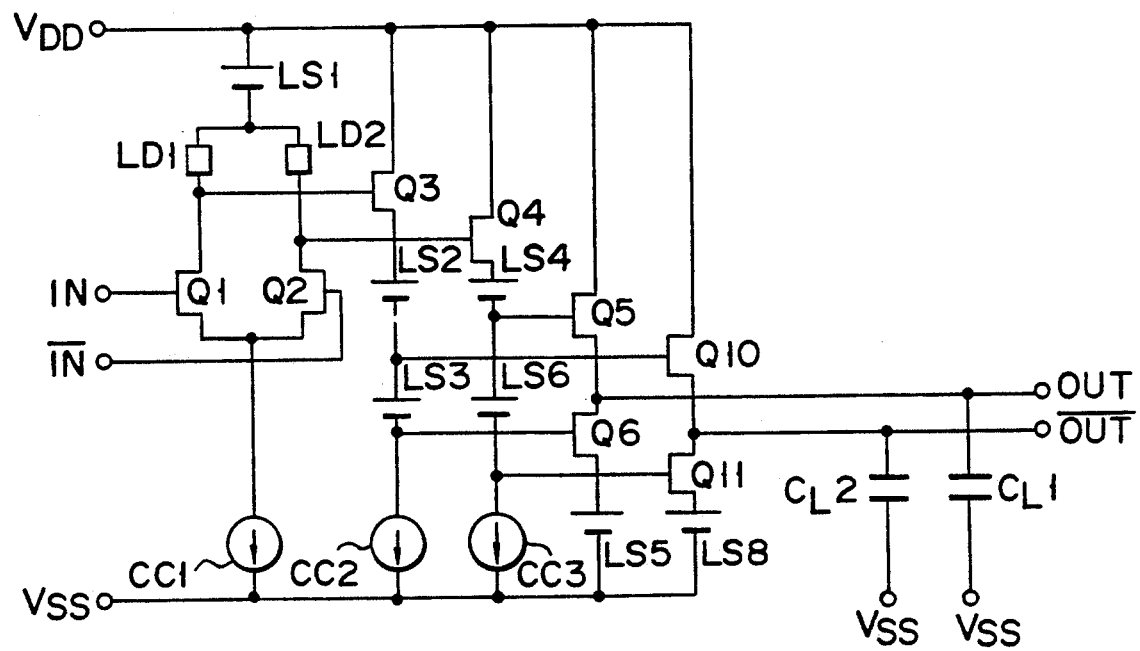
F I G. 5

SOURCE-COUPLED FET LOGIC TYPE OUTPUT CIRCUIT

BACKGROUND OF THE INVENTION

1. Field of the Invention

The present invention relates to an output circuit using a field effect transistor (FET), and more particularly, to a source-coupled FET logic type output circuit.

2. Description of the Related Art

A conventional source coupled FET logic (hereinafter called SCFL) type output circuit is shown in FIG. 1. In the same figure, one electrode of a level shift element LS1 is coupled to a high-voltage power source $V_{DD}$, with another electrode connected to a one electrode of load element LD and the drain electrode an FET Q1, respectively. Further, the other electrode of the load element LD is coupled to the drain electrode of another FET Q2, and also to the gate electrode of second another FET Q3 of which drain electrode is connected to the high-voltage power source $V_{DD}$. The FETs Q1 and Q2 have their gate electrodes applied as respective input terminals IN and $\overline{\text{IN}}$, and their respective source electrodes connected together and also connected to a low-voltage power source $V_{SS}$ through a constant current power source CC1. The source electrode of the FET Q3 is connected to the power source $V_{SS}$ by a constant current source CC2. The source electrode of the FET Q3 is connected to the low-voltage power source $V_{SS}$ by a resistor R. The source electrode of the FET Q3 is used as an output terminal, and is connected to the low-voltage power source VSS by a capacitive load $C_L$.

In the SCFL type output circuit arranged such as the above, the input terminals IN and $\overline{\text{IN}}$ commonly have a complementary signal applied thereto, wherein if the input terminals IN and $\overline{\text{IN}}$ are set to a low level and a high level, respectively, the FET Q1 is turned off and the FET Q2 is turned on. The potential difference $V_{GS}$ between the gate and source electrodes of the FET Q3 therefore decreases, whereby the FET Q3 subsequently is turned off. This results in that the charge thus far stayed in the capacitive load $C_L$ is discharged via the resistor R, and thereby the output terminal OUT becomes to be of a low level.

Now, applying the SCFL type output circuit such configured as the above for a high-speed integrated circuit is preceded by a prerequisite that charging and discharging the capacitive $C_L$ must be implemented quickly. However, generally, the capacitive $C_L$ is greatly large as compared with the gate capacity of each FET incorporated in the SCFL type output circuit. This signifies that much time is required to discharge the capacitive load $C_L$. Therefore, to meet the above-capacitive remarked prerequisite, it is needed to lessen the time of discharging by decreasing the resistance of the resistor R. But the past attempts thus far undertaken to reduce the resistance of resistor R came across a a problem that the power consumption went up in response to the flow of an unnecessarily large current for charging the capacitive load $C_L$.

SUMMARY OF THE INVENTION

Accordingly, it is an object of the present invention to provide a source-coupled FET logic type output circuit of a high-speed design with low power consumption realized.

According to one aspect of the present invention, there is provided an output circuit comprising: first and second input terminals for receiving two complementary signals, respectively; a first constant current source; differential switching means having first and second switching means, the first switching means having a control terminal connected to the first input terminal, and a current path connected, at one end, to a high-voltage power source by a load element, and the second switching means having a control terminal connected to the second input terminal, and a current path connected, at one end to the high-voltage power source by the load element and, at the other end, to the other end of the current path of the first switching means, the other ends of the current paths of the first an second switching means being connected to a low-voltage power source by the first constant current source; second and third constant current sources; third switching means having a control terminal connected to one end of the first switching means, and a current path connected, at one end, to the high-voltage power source and, at the other end, to the low-voltage power source by the second constant current source; fourth switching means having a control terminal connected to one end of the second switching means, and a current path connected, at one end, to the high-voltage power source and, at the other end, to the low voltage power source by the third constant current source; an output terminal; fifth switching means having a control terminal connected to the one end of the current path of said fourth switching means, and a current path connected, at one end, to the high-voltage power source; and sixth switching means having a control terminal connected to the one end of the current path of said third switching means, and a current path connected, at one end, to the output terminal and, at the other end, to the low-voltage power source.

According to another aspect of the present invention, there is provided an output circuit comprising first and second load elements having one end coupled respectively to a high-voltage power source, and first and second switching means coupled respectively to first and second input terminals in a manner that a complementary signal may be input to each of the control terminals, and having current paths connected, at one end, to the other ends of the first and second load elements and connected together, at the other end; a first constant current power source connected between the other ends of the respective current paths of the first and second switching means, and a low-voltage power source; third switching means having a current path connected, at one end, to the high-voltage power source and its control terminal coupled to one end of the first switching means; a first level shift element having one end connected to the other end of the current path of the third switching means; a second constant-current power source coupled between the other end of the first level shift element and the low-voltage power source; fourth switching means having a current path coupled, at one end, to the high-voltage power source, and a control terminal connected to the one end of the current path of the second switching means; second level shift element connected, at one end, to the other end of the current path of the fourth switching means; a third constant-current power source connected between the other end of the second level shift element and the low-voltage power source; fifth switching means having a current path coupled, at one end, to the high-voltage power source and, at the end, to the output terminal, and a control terminal connected to the other end of the second level shift element; and sixth switching means having a current path coupled, at one end, to the other end of the current path of the fifth switching means and, at the other end, to the low-voltage power source, and a control terminal coupled to the other end of the first level shift element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a circuit configuration diagram showing how the source-coupled FET logic type output circuit in the first embodiment of the present invention is arranged;

FIG. 3 is a circuit configuration diagram showing the SCFL type output circuit in the second embodiment of the present invention;

FIG. 4 is a circuit configuration diagram showing the SCFL type output circuit in the third embodiment of the present invention; and FIG. 5 is a circuit configuration diagram showing the SCFL type output circuit in the fourth embodiment of the present invention.

DETAILED DESCRIPTION OF THE PREFERRED EMBODIMENTS

Figure 1:
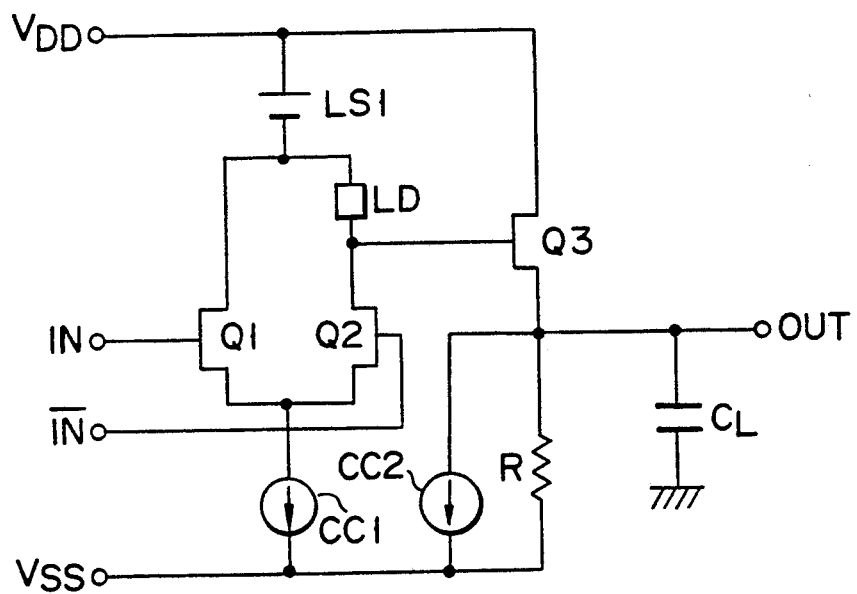
FIG. 1 is a circuit configuration diagram showing how the SCFL type output circuit of the prior art is fabricated.

Now some embodiments of the present invention. As regards the embodiments to be described hereunder, the parts identical with those used in the SCFL type output circuit of the prior art have their description omitted, with the same reference numerals provided for such parts, which coincide with the reference numerals originally given to those in the output circuit.

Presented in FIG. 2 is a circuit configuration diagram of the SCFL type output circuit in the first embodiment of the present invention. With reference to the same figure, one electrode of a level shift element LS1 is connected a high-voltage power source $V_{DD}$, with the other electrode coupled to load elements LD1 and LD2. The drain electrodes respectively of the field effect transistors (FET) Q1 and Q2 are coupled to the load elements LD1 and LD2. Besides, the gate electrodes of FETs Q3 and Q4 are connected to the drain electrode of the FETs Q1 and Q2. It is noted that the drain electrodes respectively of the FETs are connected to the high-voltage power source VDD. The FETs Q1 and Q2 have their gate electrodes used as input terminals IN and $\overline{IN}$, with their source electrodes coupled together and to a low-voltage power source VSS by a constant-current power source CC1.

Further, the source electrode of the FET Q3 is grounded not only through respective level shift elements LS2 and LS3 which are serially coupled to each other, but also via a constant-current power source CC2. Likewise with the FET Q3, the source electrode of the FET Q4 is connected to the low-voltage power source $V_{SS}$ by a level shift element LS4 and a constant-current power source CC3.

In addition, to the connecting point of the level shift element LS4, the gate electrode of an FET Q5 which has its drain electrode coupled to the high-voltage power source $V_{DD}$, is connected. Similarly to the above, to the connecting point of the level shift element LS3 and the constant-current power source CC2, the gate electrode of an FET Q6 which has its drain electrode connected to the source electrode of the FET Q5. And the source electrode of the FET Q6 is connected to the low-voltage power source $V_{SS}$ by a level shift element LS5. Further, the connecting point of the FETs Q5 and Q6 is connected to not only the output terminal OUT, but also to one end of the capacitive load $C_L$ connected, at the other end, to the low-voltage power source $V_{SS}$.

It is noted that the level shift element LS3 is essential to secure a voltage $V_{GS5}$ between the gate electrode and source electrode of the FET Q5, and a voltage $V_{DG6}$ between the drain electrode and source electrode of FET Q6.

Subsequently, the output circuit configured as in the foregoing is described with regard to how it runs. Again with reference to FIG. 2, each of the input terminal IN and $\overline{IN}$ is fed with a complementary signal. In this case, the potential transitions respectively to a high level with the input terminal IN and a low level with the input terminal $\overline{IN}$ concur with turning on the FET Q1 and turning off the FET Q2. As a consequence, the gate electrode of the FET Q3 is rendered to be of a low level, with the gate electrode of the FET Q4 getting into the state of a high level. Thus, the gate electrode of the FET Q5 which is controlled by the FET Q4 via the level shift element LS4 results in getting into the state of a high level.

In the meanwhile, the potential level of the gate electrode of the FET Q6 which is controlled by the FET Q3 through the level shift elements LS2 and LS3 goes down low. This entails that the FET Q5 turns on and the FET Q6 is switched off, with a current starting to flow through the FET Q5. As a result, the capacitive load $C_L$ is charged with the current from the FET Q5, with a high-level output signal emerging simultaneously at the output terminal OUT.

On the other hand, the potential transitions to a low level with the input terminal IN and a high level with the input terminal $\overline{IN}$ contrary to the above, entails turning off the FET Q1 and turning on the FET Q2, whereby the gate electrode of the FET Q3 goes into the state of a high level and the gate electrode of the FET Q4 has its potential decreased to a low level. The result is that the gate electrode of the FET Q5 gets into the state of a low level, with the gate electrode of the FET Q6 becoming to be of a high level; namely, the FET Q5 is switched off and the FET Q6 on, whereby the charge held in the capacitive load CL is let out via the FET Q6 and the level shift element LS5, with a low level output signal emerging at the output terminal OUT as a result.

It is noted that, in the output circuit configured such as the above the level shift element LS4 provided therein lessens a voltage $V_{GS6}$ between the gate electrode and source electrode of the FET Q6 lower than the forward directional voltage of a schottky diode, thereby to prevent the current from the gate electrode from flowing into the schottky diode. Therefore, with this in view, it is understood that a certain circuit configuration of this output circuit renders unnecessary to apply the level shift element LS4.

Furthermore, depending on what is the set-point selected for an FET threshold voltage, it likewise becomes unnecessary to employ the level shift element LS1. Additionally, with the level shift elements LS2 and LS3, their quantities are variable with output level requirements.

In the above-remarked output circuit, the circuit configuration is such that charging the capacitive load $C_L$ coincides with working the FET Q5 as an active element while discharging the capacitive load concurs with working the transistor Q6 as an active element. Therefore, where the current flowing in the FET Q5 is equal to the current of the FET Q6, the times required respectively for charging and discharging are equalized, whereby it is rendered feasible to output a high-speed signal without flowing a surplus current in each of these transistors, thus resulting in being practicable to fabricate the SCFL output circuit in a high-speed, low power consumption design.

FIG. 3 is a circuit configuration diagram showing the second embodiment of the present invention. The second embodiment is realized with a SCFL output circuitry configured such as in FIG. 2. As regards the arrangement and operation of those other than the circuit elements referred to herein the second embodiment is identical with first embodiment, the description of such circuit elements as the above is omitted, accordingly.

Namely, in the second embodiment, resistors R1, R2, and R3 are used for the level shift element LS1, and the load elements LD1 and LD2 shown in FIG. 2. Further for the level shift elements LS2, LS3, and LS4, schottky diodes D1, D2, and D3 are installed. And also for a level shift element LS5, a serial circuit comprised of schottky diodes D4 and D5 is provided. Moreover, the constant-current power sources CC1, CC2, and CC3 may comprise each of serial circuits made up of an FET Q7 and a resistor R4, and FET Q8 and a resistor R5, and an FET Q9 and a resistor R6. It is noted that $V_b$ in FIG. 2 stands for a given external bias power source.

FIG. 4 is a circuit configuration diagram of the output circuit in the third embodiment which gives an instance wherein said schottky diodes D4 and D5 incorporated in the circuit of such a configuration as specified in FIG. 3 are replaced with resistors R7 and R8. As regards the arrangement and operation of other circuit components, the third embodiment is identical with the above-mentioned first and second embodiments. Therefore, such circuit components are not described herein.

Illustrated in FIG. 5 is a circuit configuration diagram showing the fourth embodiment wherein there is provided such an output circuit which enables to generate a complementary output signal, and of which configuration is an alteration from the second embodiment in FIG. 2. With regard to the fourth embodiment, only those parts which are different from the counterparts in the second embodiment, are described herein. No description is provided for other parts, for they are identical with those used in the second embodiment in FIG. 2.

Precisely with the fourth embodiment in respect of circuit configuration, between the level shift element LS4 and the constant-current power source CC3, a level shift element LS6 is inserted and electrically connected therein as shown in FIG. 5. The gate electrode of the FET Q5 is coupled to the connecting point of the level shift elements LS4 and LS6. Further, to the connecting point of the level shift elements LS2 and LS3, the gate electrode of an FET Q10 of which drain electrode is connected to the high-voltage power source $V_{DD}$, is coupled. Besides, to the connecting point of the level shift element LS6 and the constant-current power source CC3, the gate electrode of an FET Q11 whose drain electrode is connected to the source electrode of an FET Q10, is coupled. The source electrode of an FET Q11 is connected to the low-potential power supply via a level shift element LS8.

The output terminal OU due to be coupled between the FETs Q5 and Q6 is connected to the low-potential power supply through the capacitive load $C_L$. Similarly, an output $\overline{OUT}$ to be coupled between FETs Q10 and Q11 is grounded via a capacitive load $C_L2$.

Next, how the output circuit configured such as the above runs is described hereunder. For example, the potential transitions respectively to a high level with the input terminal IN and a low level with the input terminal $\overline{IN}$ coincide with turning on the FET Q1 and turning off the FET Q2. This results in bringing the potential at the gate electrode of the FET Q3 into the state of a low level, with the gate electrode of the FET Q4 getting into the state of a high level, whereby the gate electrode of the FET Q5 controlled by the FET Q4 via the level shift element LS4 has its potential raised to a high level.

Further, both the gate electrode of an FET Q10 and the gate electrode of FET Q6 controlled by the FET Q3, respectively through the level shift elements LS2 and LS3 have their potential decreased to a low level. This results in turning on FETs Q5 and Q11, with the FETs Q10 and Q6 turning off, whereby a current flows both the FETs Q5 and Q11. Thus, a capacitive load $C_L1$ is charged with the current from FET Q5. As a consequence, there appears an output signal of a high level potential at the output terminal OUT. Meanwhile, the FET Q6 turns off and the FET Q11 at this stage, whereby the charge held in the capacitive load $C_L2$ is let out via the FET Q11 and a level shift element LS8, with an output signal of a low level potential emerging at the output terminal $\overline{OUT}$ as a results.

Where the input terminal IN has its potential decreased to a low level, with the input terminal $\overline{IN}$ getting into the state of a high level, contrary to the above, the output circuit concerned counter-runs, with a low level potential output signal appearing at the output terminal OUT and a high-level potential output signal emerging at the output terminal $\overline{OUT}$ as a result.

In such a circuit configuration, inputting a complementary signal to the input terminals IN and $\overline{IN}$ results in generating a complementary signal with the potential corresponding to the input complementary signal. Therefore, the fourth embodiment can be applied not only as an output circuit but also as an internal circuit in IC (integrated circuit) devices.

As in the foregoing, according to the present invention, there can be provided a source-coupled FET logic type output circuit of a high speed design with low power consumption realized.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. An output circuit comprising:

first and second input terminals for receiving two complementary signals, respectively;

a first constant current source;

differential switching means having first and second switching means, said first switching means having a control terminal connected to said first input terminal, and a current path connected, at one end, to a high-voltage power source by a load element, and said second switching means having a control terminal connected to said second input terminal, and a current path connected, at one end to said high-voltage power source by said load element and, at the other end, to the other end of the current path of said first switching means, the other ends of the current paths of said first and second switching means being connected to a low-voltage power source by said first constant current source;

second and third constant current sources;

third switching means having a control terminal connected to one end of said first switching means, and a current path connected, at one end, to said high-voltage power source and, at the other end, to said low-voltage power source by said second constant current source;

fourth switching means having a control terminal connected to one end of said second switching means, and a current path connected, at one end, to said high-voltage power source and, at the other end, to said low voltage power source by said third constant current source;

an output terminal;

fifth switching means having a control terminal connected to the one end of the current path of said fourth switching means, and a current path connected, at one end, to said high-voltage power source; and sixth switching means having a control terminal connected to the one end of the current path of said third switching means, and a current path connected, at one end, to said output terminal and, at the other end, to said low-voltage power source.

2. An output circuit according to claim 1, wherein said first and second switching means each comprise a field effect transistor.

3. An output circuit according to claim 1, wherein said first and second switching means each comprise a field effect transistor.

4. An output circuit comprising:

first and second load elements having one end coupled respectively to a high-voltage power source, and first and second switching means coupled respectively to first and second input terminals in a manner that a complementary signal may be input to each of the control terminals, and having current paths connected, at one end, to the other ends of said first and second load elements and connected together, at the other end;

a first constant current power source connected between the other ends of the respective current paths of said first and second switching means, and a low-voltage power supply;

a third switching means having a current path connected, at one end, to said high-voltage power source and its control terminal coupled to one end of said first switching means;

a first level shift element having one end connected to the other end of the current path of said third switching means;

a second constant-current power source coupled between the other end of said first level shift element and said low-voltage power source;

fourth switching means having a current path coupled, at one end, to said high-voltage power source, and a control terminal connected to one end of the current path of said second switching means;

a second level shift element connected, at one end, to the other end of the current path of said fourth switching means;

a third constant-current power source connected between the other end of said second level shift element and said low-voltage power source;

fifth switching means having a current path coupled, at one end, to said high-voltage power source, and, at the other to an output terminal, and a control terminal connected to the other end of said second level shift element; and sixth switching means having a current path coupled, at one end, to the other end of the current path of said fifth switching means and, at the other end to said low-voltage power source, and its control terminal coupled to the other end of said first level shift element.

5. An output circuit according to claim 4, further comprising third level shift element coupled between said high-voltage power source, and the one end of said first and second load element.

6. An output circuit according to claim 4, further comprising fourth level shift element coupled between the other end of said sixth switching means and said low-voltage power source.

7. An output circuit according to claim 4, wherein said first and second switching means, and said third, fourth, fifth, and sixth switching means each comprise a field effect transistor.

8. An output circuit according to claim 4, wherein said first and second level shift elements each comprise a schottky diode.

9. An output circuit according to claim 4, wherein said first, second and third constant-current power sources each comprise a field-effect transistor.

10. An output circuit according to claim 9, wherein said first, second, and third constant-current power sources each comprise a resistor and a field effect transistor.

11. An output circuit according to claim 4, wherein said first and second switching means make up a differential amplifier.

12. An output circuit according to claim 4, further comprising seventh switching means having a current path connected, at one end, to said high-voltage power source and, at the other end, to a second output terminal, and a control terminal connected to the other end of the first level shift element, and eighth switching means having a current path connected, at one end, to the other end of the current path of said seventh switching means and, at the other end, to said low-voltage power source, and a control terminal connected to the other end of said fourth switching means.

13. An output circuit according to claim 12, further comprising fifth level shift element coupled between the other end of said eighth switching means and said low-voltage power source.

* * * * *